United States Patent [19]

Blaum et al.

[11] Patent Number: 5,299,208
[45] Date of Patent: Mar. 29, 1994

[54] ENHANCED DECODING OF INTERLEAVED ERROR CORRECTING CODES

[75] Inventors: Miguel M. Blaum, San Jose, Calif.; Henricus C. Van Tilborg, Best, Netherlands

[73] Assignee: International Business Machines Corporation, Armonk, N.Y.

[21] Appl. No.: 792,113

[22] Filed: Nov. 14, 1991

[51] Int. Cl.$^5$ ............................................. G06F 11/00
[52] U.S. Cl. ..................................... 371/38.1; 371/39.1
[58] Field of Search ........................ 371/38.1, 39.1, 2.1

[56] References Cited

U.S. PATENT DOCUMENTS 4,559,625 12/1985 Berlekamp et al. .................. 371/2

OTHER PUBLICATIONS

Clark et al., Error-Correction Coding for Digital Communications, published by Plenum Press, 1981.
M. Blaum, P. Farrell, H.C. Van Tilborg, "A Class of Burst Error-Correcting Array Codes," IEEE Trans. Inform. Theory IT-32-6 Nov. 1986, pp. 836-839.
W. Zhang, J. Wolf, "A Class of Binary Bust Error-Correcting Quasi-Cyclic Codes," IEEE Trans. Inform. Theory IT-34-3 May 1988 pp. 463-479.
M. Blaum, P. Farrell, H. C. Van Tilborg, "Multiple Burst Correcting Array Codes," IEEE Trans. Inform. Theory IT-34-5, Sep. 1988, pp. 1061-1066.
IBM Technical Disclosure Bulletin vol. 32 No. 5A Oct. 1989.

Primary Examiner—Robert W. Beausoliel, Jr.
Assistant Examiner—Phillip Vales
Attorney, Agent, or Firm—Henry E. Otto, Jr.

[57] ABSTRACT

Decoding power is enhanced by (1) flagging only those codewords where the ECC capability has been exceeded; (2) permitting codewords to be of any byte length (n) and codeword depth ($\lambda$) subject only to the requirement that n and $\lambda$ be relatively prime; and (3) interleaving encoded bytes of successive codewords diagonally in a single continuous sequence to form an array with a toroidal topology so that all burst errors will be continuous from codeword to codeword, irrespective of where they occur in the array. These attributes assure that there will never be a problem with burst errors affecting $\leq \lambda$ rows because there is no "last row" and "first row".

6 Claims, 5 Drawing Sheets

ENHANCED DECODING OF INTERLEAVED ERROR CORRECTING CODES

FIELD OF THE INVENTION

This invention relates to error correcting codes, and relates more particularly to methods for enhancing the power of decoders of interleaved codewords of error correcting codes for channels where a significant number of burst errors occur with random errors.

BACKGROUND OF THE INVENTION

The most common technique for correcting a mixture of burst errors and random errors in data is by interleaving the codewords of an error correcting code (ECC). The conventional interleaving approach is to encode bytes 0 of each successive codeword columnwise, then bytes 1 of each codeword, etc., until all bytes of all codewords in each of a series of successive rectangular blocks have been written; whereas all codewords in each particular block are decoded successively row by row. As a result of this interleaving, an m-burst error will be spread serially over m successive codewords instead of all or most of all of these m errors being in a single codeword. This interleaving hopefully will assure that the error correction capability of each individual codeword will not be exceeded.

Various interleaving techniques are described by Clark et al. in "Error-correction Coding for Digital Communications", published by Plenum Press, 1981.

A widely used ECC is a so-called Reed-Solomon (RS) code. RS codes are byte-correcting codes over the finite Galois field denoted as GF(q), where q is a power of a prime number. A common value for q is $2^8$. An [n,k] RS code is one where the length n of a codeword in bytes is $\leq q-1$; the number of information bytes is k; the number of redundant bytes r is n—k; and the minimum distance d of the code is $(n-k)+1$. An [n,k] RS code can correct s errors and t erasures if $2s+t \leq (n-k)$. "Erasures" are errors where the location is known. Since one error is thus roughly equivalent to two erasures, the power of a decoder can be enhanced without increasing redundancy by treating certain errors as erasures.

U.S. Pat. No. 4,559,625 is the only prior art known to applicants which describes a forecasting technique to treat errors as erasures and thereby attempts to enhance decoding power. This patented technique has the following characteristics:

(1) If the codewords have a length (n) of 128 bytes, which is common, this technique requires that 127 (n—1) codewords (an undesirably high number) must be interleaved to complete helical symmetry; otherwise, additional complexities will be introduced in the burst forecasting technique.

(2) Whenever a codeword has a correctable error, the locations in the next codeword adjacent to each such error are flagged, and errors are automatically forecasted as erasures at these adjacent locations.

(3) Codewords are encoded in staggered blocks; i.e., row by row but with corresponding bytes of successive codewords laterally offset from codeword to codeword.

These characteristics and their consequences will be discussed more fully in the following description.

There is a need for a technique for decoding ECC codewords that enhances the decoding power over that described in the prior art.

SUMMARY OF THE INVENTION

Toward this end and according to the invention, decoding power is enhanced by (1) flagging only those codewords where the ECC capability has been exceeded; (2) permitting codewords to be of any byte length (n) and codeword depth ($\lambda$) subject only to the requirement that n and $\lambda$ be relatively prime; and (3) interleaving encoded bytes of successive codewords diagonally in a single continuous sequence to form an array with a toroidal topology so that all burst errors will be continuous from codeword to codeword, irrespective of where they occur in the array. These attributes assure that there will never be a problem with burst errors affecting $\leq \lambda$ rows because there is no "last row" and "first row".

BRIEF DESCRIPTION OF THE DRAWINGS

FIG. 1 depicts in simplified form the data writing sequence for the helical interleaving method described in cited U.S. Pat. No. 4,559,625.

FIG. 3 shows a simplified data writing sequence for a toroidal interleaving method according to the present invention.

FIG. 4 is a schematic representation of an error pattern.

FIG. 6 is a schematic representation of an error pattern somewhat different from that in FIG. 4.

DESCRIPTION OF THE PRIOR ART

Figures 1, 3, 4, 6:
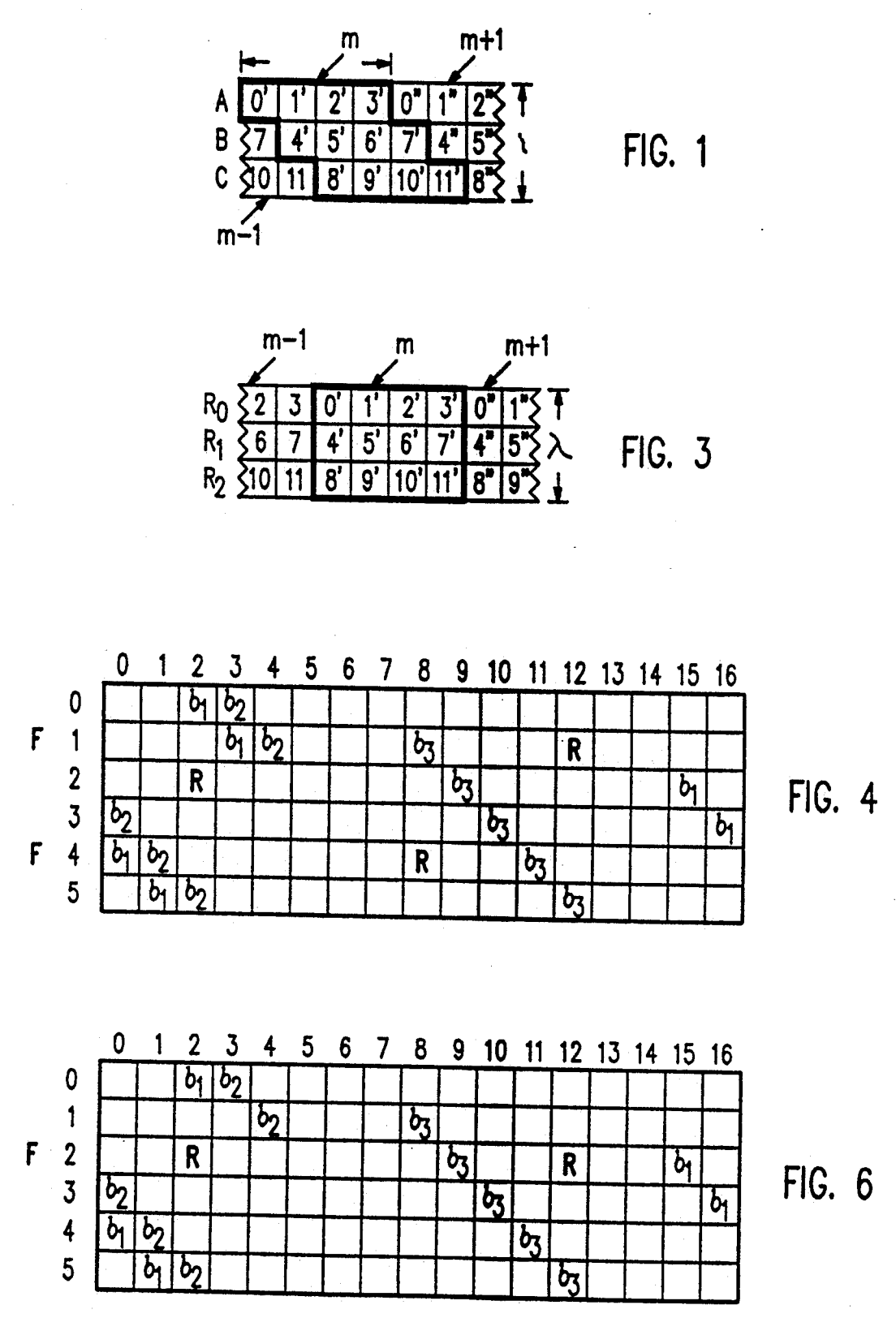

To facilitate an understanding of the present invention, the data writing sequence of the helical interleaving method described in U.S. Pat. No. 4,559,625 is depicted in FIG. 1 in simplified form.

Bytes are written vertically during encoding in the following sequence: 0', 7, 10, 1', 4', 11, 2', 5', 8', 3', 6', 9', 0'', 7', 10', 1'', 4'', 11'. Thus, bytes are encoded as staggered blocks, like blocks m—1, m, and m+1 in FIG. 1. Block m comprises codewords each n bytes long and having an interleaving depth i; but the codewords 0'-3', 4'-7', and 8'-11' are laterally offset in a staggered manner. The bytes 0'-11' of block m are decoded by decoding rows A, B, C in sequence; then bytes 0''-11'' (not all shown) for block m+1 by decoding in sequence, etc. Decoding will progress without delay until an error is detected.

Assume now that an error is detected at 2' (byte 3 in codeword A). The vertically adjacent location 5' in B will automatically be flagged as an erasure after the ECC is applied to A to correct the error. The ECC is then applied to codeword B. If correction is successful, a check is made to determine whether byte 5' was in fact in error. If it was not, the flag is removed from that byte location. If byte 5' was in error, codeword C will be flagged and an erasure predicted and declared automatically for byte 8' (the first byte of C). The process will be repeated as subsequent blocks m+1 are decoded. In other words, whenever an error occurs in one codeword, the patentees automatically predict erasures in all locations in the next codeword vertically adjacent to each location in error in said one codeword. This undesirably can result in the ECC capability being exceeded where in fact a codeword was correctable.

Moreover, to provide helical symmetry, the patentees require that $i=n-1$; that is, the depth of interleaving must be precisely one less than the number of bytes in a codeword. The patentees do this so that the last row (C in FIG. 1) does not have to be treated as a special row when using their forecasting technique. For example, if $i<(n-1)$, the regularity of the helix is broken. Stated differently, if in FIG. 1 only the two rows A, B are interleaved, the sequence cannot wrap around from 7 to 1', as it does with rows A, B, C from 10 to 1', without breaking the helical symmetry.

DESCRIPTION OF THE PREFERRED EMBODIMENTS

Figure 2:
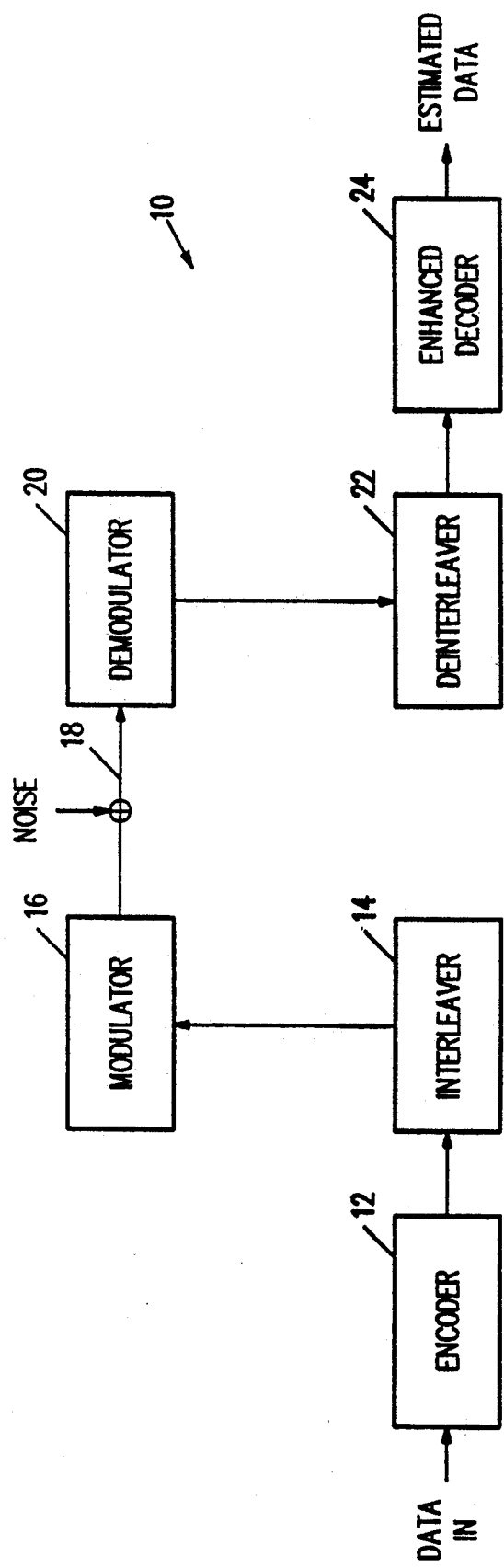
FIG. 2 is a schematic diagram of an apparatus embodying the invention for encoding and decoding digital data transmitted over a communication channel.

FIG. 2 depicts an apparatus 10 embodying the invention for encoding and decoding digital data transmitted over a communications channel where a significant number of burst errors occur with random errors. As illustrated, apparatus 10 comprises an encoder 12 that converts a digital data input into a stream of symbols forming codewords, each n bytes in length. The symbols of the encoded codewords are resequenced by interleaver 14 in the manner presently to be described. A modulator 16 prepares the signal to be transmitted to channel 18 by converting the interleaved codewords into a run length limited code, such as a (1,7) code.

A demodulator 20 processes the signal from the channel into digital data, reproducing the stream of symbols, degraded by any noise, etc., on the channel, and outputs the demodulated stream to a deinterleaver 22. Deinterleaver 22 resequences the interleaved symbol stream by an operation inverse to that of interleaver 14. The codewords are then passed to an enhanced RS decoder 24 which can output an estimate of the original data in cases where a conventional RS decoder could not by extending the error correcting capability of the code without requiring additional redundancy.

The term "symbol", as herein used in the specification and claims, is intended generically to connote bytes, halfwords, words, or any other preselected number of bits. However, to facilitate understanding, the description has and will most frequently refer to bytes.

Also, as hereinafter used, the notation $<m>_n$ denotes the unique integer i such that $m \equiv i$ (modulo n) and $0 \leq i \leq n-1$.

The first step in implementing applicants' invention is to select an ECC code which permits interleaving encoded codewords n bytes in length to a depth $\lambda$ subject only to the caveat that n and $\lambda$ be relatively prime. For example, if $n=128$ and $\lambda=9$, n and $\lambda$ are relatively prime even though 9 and 128 by themselves are not prime numbers. Obviously, then, if $\lambda=3, 5, 7, 11$ or some other number which itself is prime and n is not divisible by $\lambda$, the caveat is clearly met.

The ECC comprises a plurality of rectangular blocks (e.g., $m-1, m, m+1$). For a simplified example and as illustrated in FIG. 3, each block comprises codewords having a length n of four bytes and a depth $\lambda$ of three rows of codewords. Each block consists of rows $a_{i,0}, a_{i,1}, \ldots, a_{i,n-1}$ where $0 \leq i \leq \lambda-1$. According to the invention, interleaver 14 rearranges and transforms these $\lambda$ rows into $\lambda$ diagonals, block by block, according to the following algorithm, starting with the first block where n and $\lambda$ are relatively prime.

(1) Make $i=0$ and $j=0$.
(2) Write $a_{i,j}$.
(3) If $i=\lambda-1$ and $j=n-1$, go to step 5.
(4) Else make $i=<i+1>_\lambda$ and $j=<j+1>_n$ and go to step 2.
(5) End if this is the last block.
(6) Else execute steps 1-4 on succeeding block.

Because n and $\lambda$ are relatively prime, writing of all bytes is guaranteed by the use of applicants' technique.

The diagonal interleaving technique defined by the above algorithm generates an array pattern with a toroidal topology; i.e., analogous to a single wire wrapped diagonally around a donut and with the trailing end of each block joined to the leading end of the succeeding block. With this topology, a burst error affecting $\leq \lambda$ rows is continuous in the sense that there is no first and last row, as opposed to traditional interleaving in which there is a discontinuity in the last row. For example, assume $a_{0,0} \ldots a_{0,3}$ is $0' \ldots 3'$; $a_{1,0} \ldots a_{1,3}$ is $4' \ldots 7'$; and $a_{2,0} \ldots a_{2,3}$ is $8' \ldots 11'$. According to the algorithm and as illustrated in FIG. 3, the symbols in the codewords of blocks m, m+1, ... are interleaved, one block at a time, in the following sequence: 0', 5', 10', 3', 4', 9', 2', 7', 8', 1', 6', 11', 0", 5", 10", etc.

After transmission over channel 18, the codewords are deinterleaved to restore them to their preinterleaved sequence; i.e., to the sequence in which they had been encoded. Then the codewords are decoded sequentially row by row, block by block; e.g., for block m, bytes 0'-11' are decoded in sequence, row by row; then for block m+1, bytes 0"-11", etc. Decoding will progress without delay until an uncorrectable error is detected.

According to the invention and as will be explained more fully below, the decoding power of an RS decoder 24 (i.e., its capability to correct multiple burst errors) is enhanced without adding extra redundancy in the following manner:

(1) Decode all codewords (rows) of the interleaved ECC code in each block successively.
(2) After all codewords have been decoded and corrected to the ECC capability of the code in a particular block, flag all codewords in that block where ECC capability was exceeded and which thus remain uncorrected.
(3) Examine at least one codeword adjacent to each flagged codeword to determine if there were any errors in that adjacent codeword; and, if those errors and hence said adjacent codeword were corrected, identify all of the locations in error in said corrected adjacent codeword(s).
(4) Tentatively declare as erasures all (or in sequence a set or subset of) the errors in the flagged codeword that are at locations, diagonally adjacent (according to the above algorithm) to the locations in error.
(5) Attempt to decode the flagged codeword.
(6) If successful, repeat steps (3), (4), and (5) for any other flagged codewords; but if not successful, declare an uncorrectable codeword and invoke a predetermined protocol, such as a retry or terminate decoding.

Various specific techniques for implementing the invention will become apparent from the following examples and flowcharts.

EXAMPLE I

Assume an [n,k] RS code with a minimum distance d=8, enabling the code to correct three errors and detect four; that the codeword length n=17 and depth of interleaving λ=6; and that as depicted in FIG. 4, the error pattern includes three burst errors b1, b2, b3 and three random errors R. Following the steps in FIG. 5, decoder 24 decodes and corrects the errors in rows 0, 2, 3, and 5 as the errors in each of these rows do not exceed the error correcting capability of the selected RS code. But, rows 1 and 4 are flagged because they are initially uncorrectable. Since row 0 had errors at bytes 2 and 3, decoder 24 tentatively assumes these to be burst errors and declares erasures b1 and b2 at bytes 3 and 4 of row 1. This is within the ECC capability so decoder 24 now corrects the two errors b3 and R and two erasures b1 and b2. Similarly, since the errors in row 3 are at bytes 0, 10, and 16, erasures b2 and b3 are assumed at bytes 1, 11, and 0 of row 4. Decoder 24 then can and does correct the one error R and three erasures b1, b2, b3. Thus, decoding capability has been desirably enhanced without requiring extra redundancy in the form of both row and column parity bytes.

Figure 5:
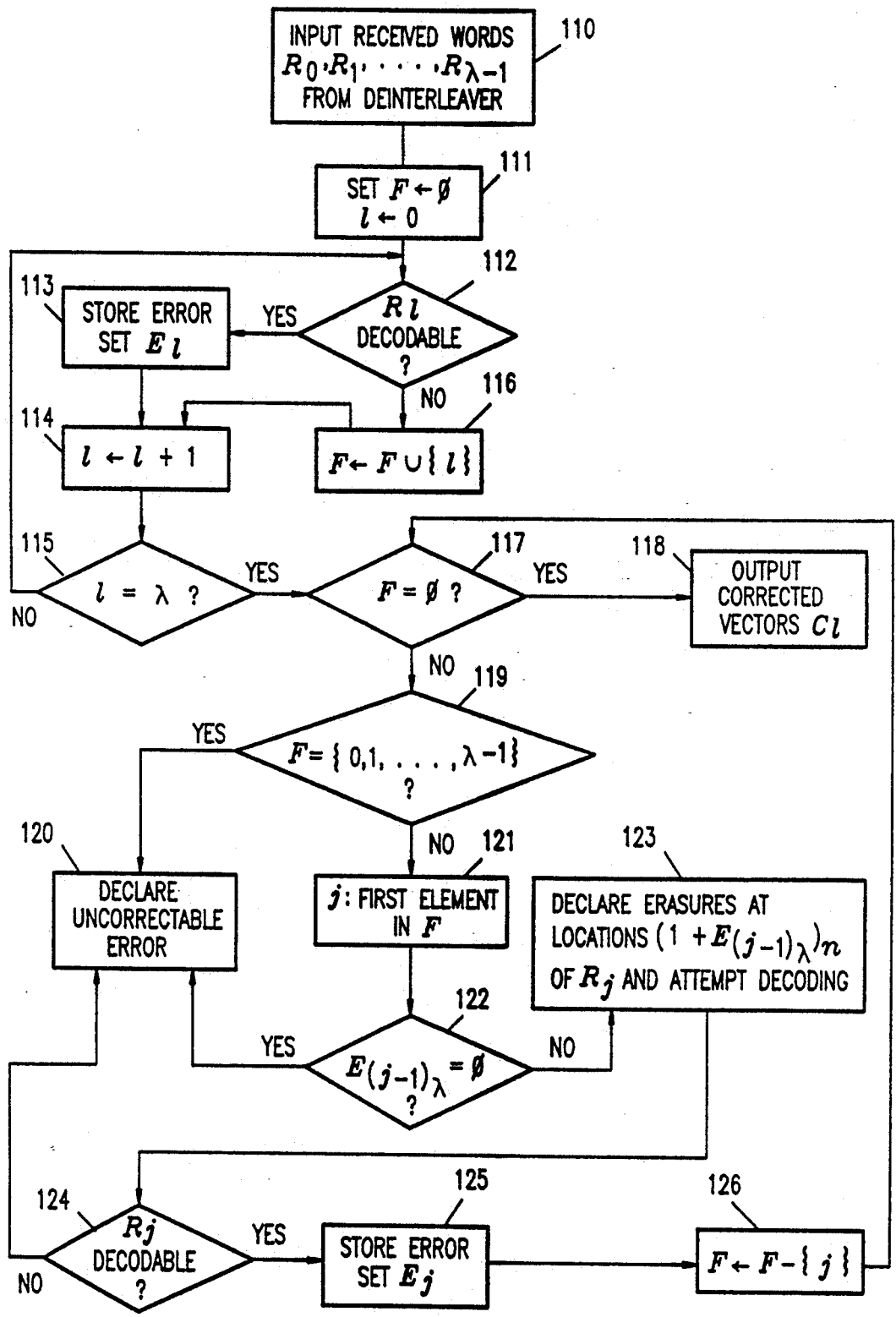
FIG. 5 is a flowchart depicting the method steps according to one technique for decoding the error pattern of FIG. 4.

More specifically, the decoding technique may be implemented by hard-wired logic or software as depicted in FIG. 5. Decoder 24 receives as input (at 110) the λ received words $R_0, R_1, \ldots, R_{80-1}$ from deinterleaver 22. This input is passed to box 111 which sets the set F as empty and a counter 1 to 0. Set F stores the indices of the uncorrectable received words (i.e., it flags the uncorrectable words), whereas counter 1 keeps track of the number of processed words. The output from 111 is sent to box 112 which attempts to decode the current word $R_l$. If correction is possible, then the error set $E_l$ is transferred to 113 where it is stored. If not, the index 1 is added to F at 116. The outputs from 113 and 116 are then sent to 114 where the index 1 is incremented by 1. From there, at 115, check if 1 has achieved λ; in other words, if all of the words have been processed. If they have not, the whole process is repeated at 112. If the last word has been processed, then the contents are transferred to 117 where the existence of flagged words is checked. If there are no flagged words, the corrected codewords $C_l$ are produced as output of the decoder in 118. Otherwise, the contents are transferred to 119 where the process of enhanced decoding begins.

At 119, check if all the received words are flagged. If they are, the enhanced decoder cannot operate so a predetermined protocol declaring an uncorrectable error is initiated at 120. If there are received words that are not flagged, the first element j in the set F of flags is determined at 121. Then, at 122, check if the previous error set (i.e., error set $E_{<j-1>\lambda}$) is empty. If it is empty, the error set $E_j$ cannot be retrieved so the predetermined protocol for uncorrectable errors is invoked at 120. However, if the error set $E_{<j-1>\lambda}$ is nonempty, it is used at 123 to predict errors at locations $<1+E_{<j-1>\lambda}>_n$, that are the positions in j corresponding to the diagonally offset positions of $E_{j-1}$. In these predicted locations, decoder 24 declares erasures and attempts decoding at 124. If $R_j$ is still not decodable with these erasures, the protocol is invoked at 120. If $R_j$ is now decodable, the error set $E_j$ is stored at 125, j is subtracted from F in 126, and the enhanced decoding process is resumed at 117.

EXAMPLE II

It will be seen that if there are too many random errors R in a flagged row, it may result in some false erasures in the adjacent row. This may exceed the ECC capability or cause a miscorrection.

For example, assume now the [n,k] RS code of Example I but with the error pattern depicted in FIG. 6, which differs slightly from that in FIG. 4. As before, the decoder 24 can correct three errors and detect four. The decoder corrects rows 0, 1, 3, 4, and 5 and flags row 2. Row 1 has errors at bytes 4 and 8, so erasures are declared at bytes 5 and 9 of row 2. This will result in three errors R, R and b1 and (false) erasure b2 (at byte 5) and erasure b3. This combination of errors and erasures can be detected but not corrected by the steps described in connection with FIG. 5 because it exceeds the error correcting capability of the ECC.

To overcome this problem and greatly reduce the likelihood of miscorrection, two somewhat more complex embodiments of the decoding technique will now be described.

Figure 7:
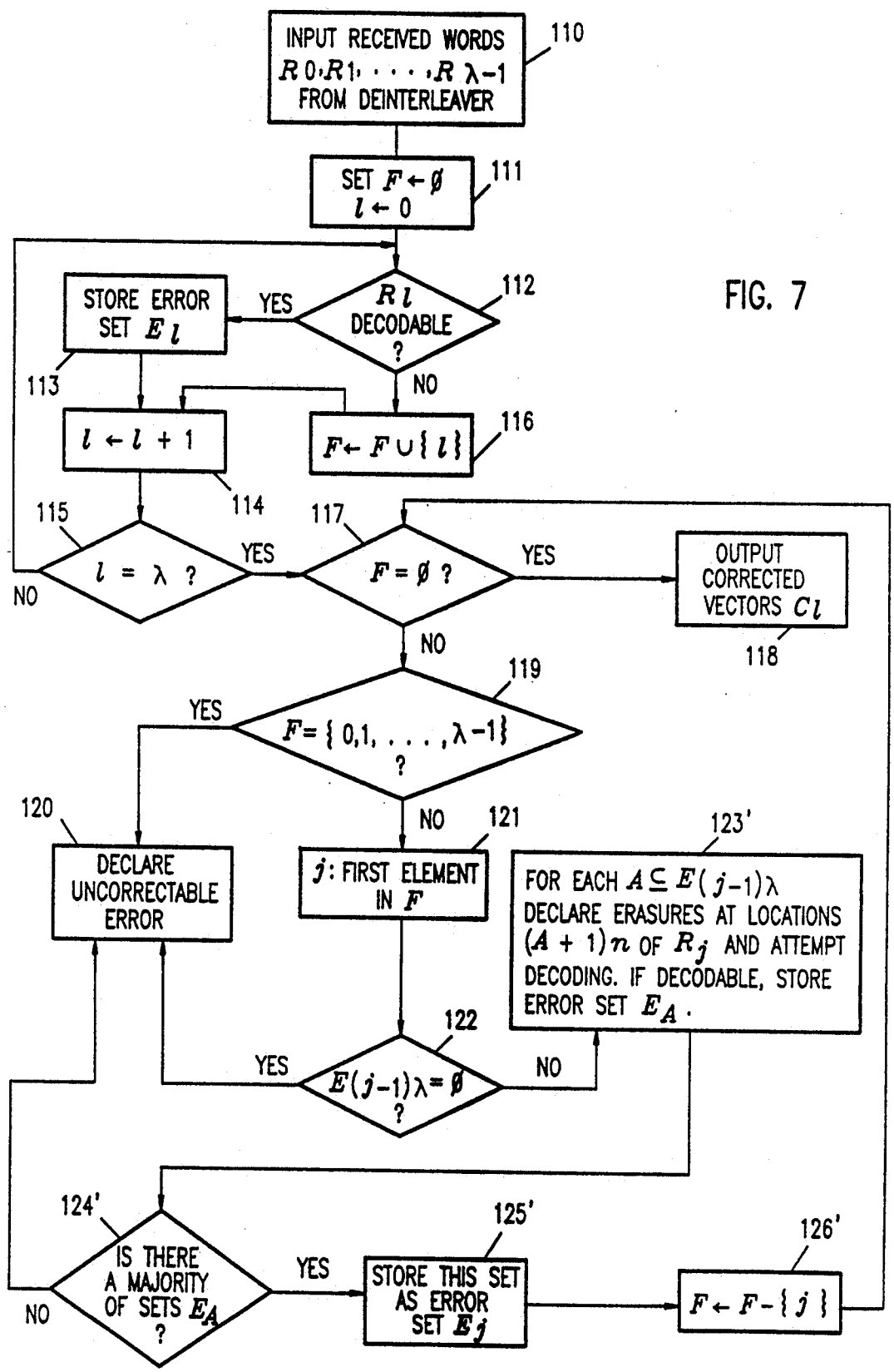
FIGS. 7 and 8, respectively, are flowcharts depicting the method steps according to alternative techniques for decoding the error pattern of FIG. 6.
Figure 8:
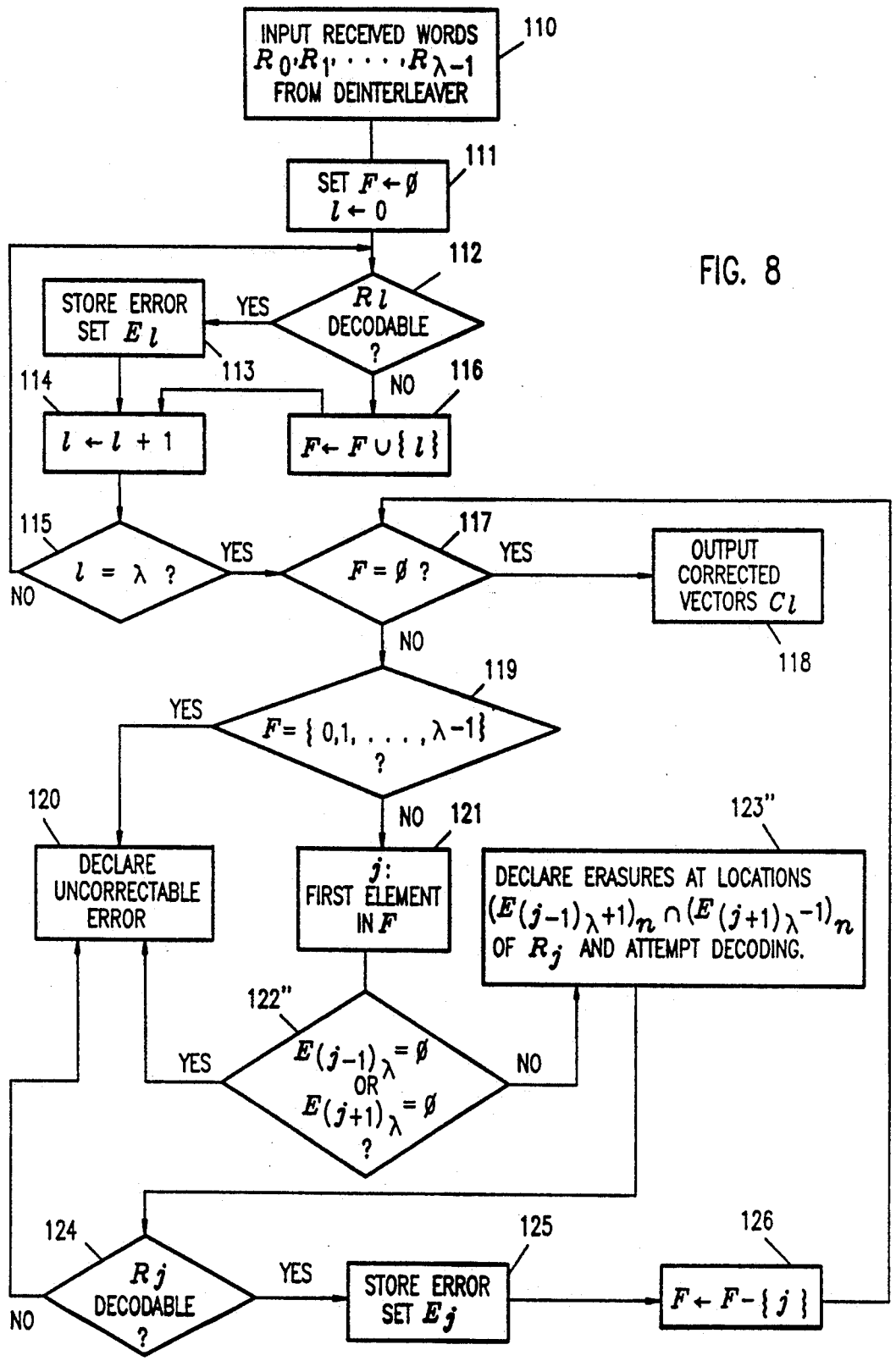

In the decoding techniques depicted in FIGS. 7 and 8, identical reference numerals will be used to designate steps which are identical with those in FIG. 5, and reference numerals primed (in FIG. 7) or double primed (in FIG. 8) will be used to designate steps which differ somewhat from those of FIG. 5.

The decoding technique shown in FIG. 7 is similar to that described in connection with FIG. 5 until step 123' is reached. There, a more complicated operation is performed. For each subset A of the error set $E_{<j-1>\lambda}$, decoding is attempted for word $R_j$ with locations $<A+1>_n$ considered as erasures. Whenever a decoding is possible, the corresponding error set $E_A$ is stored and then the contents are sent to 124' where a decision is made as to whether there is a majority of sets $E_A$. Unless there is a majority, there is an unacceptable risk that prediction of error locations is not reliable; and hence the uncorrectable error protocol is invoked at 120. Otherwise, the majority determines the error set $E_j$, which is stored at 125', and decoding proceeds as in the previous case.

The decoding technique depicted in FIG. 8 is similar to that described in connection with FIG. 5 except at 122", where both the previous and the following word corresponding to the first flagged word are examined. If either of the two is empty, the protocol for uncorrectable error is invoked at 120. If not, erasures are declared at 123" at the intersection of the diagonally adjacent locations to the error sets corresponding to words j−1 and j+1 in word j. The decoding steps then proceed normally.

While the invention has been shown and described with respect to preferred embodiments thereof, it will be understood by those skilled in the art that changes in form and detail may be made therein without departing from the scope and teaching of the invention. Accordingly, the embodiments herein disclosed are to be considered merely as illustrative, and the invention is to be limited only as specified in the claims.

We claim:

1. A method of enhancing the capability of a decoder to correct multiple burst errors in codewords comprising encoded symbols interleaved with an ECC code, comprising the steps of:

encoding codewords, each n symbols in length, in successive rows to create a series of rectangular blocks, each having λ rows of codewords, n and λ being integers and having values which are relatively prime, and the corresponding symbols of adjacent codewords in the respective rows of each block being aligned columnwise; and interleaving the symbols of successive codewords by reading them in one continuous diagonal sequence one block at a time to form an array with a toroidal topology in which the symbol at the trailing end of each block is followed by the symbol at the beginning of the succeeding block, so that all burst errors will be continuous from codeword to codeword and block to block, irrespective of where they occur in the array;

decoding all codewords, correcting all correctable errors in all correctable codewords, and flagging only those codewords in which the error correction capability of the code is exceeded;

examining at lest one codeword adjacent in time to each flagged codeword to identify the locations in error therein that have been corrected and successfully decoded;

separating the identified locations in error into sets according to a preselected protocol;

tentatively declaring, as erasures, errors in the flagged codeword at specific locations which are diagonally adjacent in time to different respective sets of said locations in error; and repeating the decoding step in an attempt to now correct and decode the flagged codeword.

2. The method of claim 1, wherein $(a_{i,j}) 0 \leq j \leq n-1$ are the symbols of codeword i, $0 \leq i \leq \lambda - 1$, and n and λ are relatively prime, interleave said symbols, and during the interleaving step, symbols of successive codewords are interleaved diagonally according to the following algorithm:

(1) Make i=0 and j=0
(2) Write $a_{i,j}$
(3) If $i=\lambda-1$ and $j=n-1$, go to step 5
(4) Else make $i=<i+1>_\lambda$ and $j=<j+1>_n$ and go to step 2
(5) End if this is the last block
(6) Else execute steps 1-4 on succeeding block for generating the array with the toroidal topology.

3. The method of claim 1, wherein at least one of said sets comprises more than one location in error, and including the step of:

declaring as erasures subsets of each set sequentially, one subset at a time, until error correction is achieved by treating the various specific locations in turn as erasures.

4. The method of claim 1, including the step of:

treating as corrected codewords only those where a majority of the decoding step attempts indicated the errors to be correctable.

5. A method of enhancing the capability of a decoder to correct multiple burst errors in codewords comprising encoded symbols interleaved with an ECC code, comprising the steps of:

decoding all codewords, correcting all correctable errors in all correctable codewords, and flagging only those codewords in which the error correction capability of the code is exceeded;

examining at least one codeword adjacent to each flagged codeword to identify the locations in error therein that have been corrected and successfully decoded;

separating the identified locations in error into sets according to a preselected protocol;

tentatively declaring, as erasures, specific locations in the flagged codeword which are diagonally adjacent in time to different respective sets of corrected locations in error; and repeating the decoding step in an attempt to now correct and decode the flagged codeword.

6. An apparatus for encoding and decoding digital data transmitted over a communications channel and capable of decoding and correcting a plurality of burst errors, comprising:

encoder means for encoding a digital data input into a stream of symbols forming codewords, each n symbols in length, in successive rows to create a series of rectangular blocks, each having λ rows of codewords, the values of λ and n being relatively prime and the corresponding symbol positions of codewords in the respective rows of each block being aligned columnwise;

interleaver means for resequencing the encoded codewords into an interleaved symbol stream in which successive codewords are read as one continuous sequence to form an array with a toroidal topology in which the symbol at the trailing end of each block is followed by the symbol at the beginning of the succeeding block;

modulator means for converting the interleaved symbol stream into a code transmitted to the channel;

demodulator means for processing the code and reproducing the stream of symbols, degraded by any noise on the channel;

deinterleaver means for generating a resequenced interleaved symbol stream by performing an operation inverse to that of said interleaver means; and a decoder for generating an estimate of said digital data input by (i) decoding the resequenced interleaved symbol stream, (ii) flagging only those codewords which were not decodable, (iii) declaring, as erasures, locations in a flagged codeword that are diagonally adjacent in time to corrected locations in error, the corrected locations in error being separated into sets according to a preselected protocol and the erasures being declared adjacent to different respective sets of these corrected locations in error, and (iv) again decoding in an attempt to now correct and decode the flagged codeword.

* * * * *